(12) United States Patent
Zhang

(10) Patent No.: US 8,779,461 B2
(45) Date of Patent: Jul. 15, 2014

(54) LIGHT EMITTING DIODE PACKAGE

(71) Applicant: Samsung Electronics Co., Ltd., Gyeonggi-do (KR)

(72) Inventor: Sung-Uk Zhang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/680,739

(22) Filed: Nov. 19, 2012

(65) Prior Publication Data

US 2013/0134472 A1    May 30, 2013

(30) Foreign Application Priority Data

Nov. 24, 2011    (KR) .................. 10-2011-0123418

(51) Int. Cl.
*H01L 33/00* (2010.01)
*H01L 33/62* (2010.01)
*H01L 33/64* (2010.01)

(52) U.S. Cl.
CPC .............. *H01L 33/62* (2013.01); *H01L 33/642* (2013.01)
USPC ........................................................ 257/99

(58) Field of Classification Search
CPC ............... H01L 33/62; H01L 33/486; H01L 2224/48091; H01L 33/38; H01L 33/642; H01L 33/005
USPC ............. 257/99, 666, 676, E33.056, E33.058
See application file for complete search history.

(56) References Cited

U.S. PATENT DOCUMENTS

| | | | |
|---|---|---|---|
| 6,373,078 B1 * | 4/2002 | Yea | 257/81 |
| 6,583,444 B2 * | 6/2003 | Fjelstad | 257/82 |
| 6,624,507 B1 * | 9/2003 | Nguyen et al. | 257/686 |
| 7,119,421 B2 * | 10/2006 | Rohrmoser et al. | 257/666 |
| 7,244,965 B2 * | 7/2007 | Andrews et al. | 257/98 |
| 2011/0316022 A1 * | 12/2011 | Hussell | 257/98 |
| 2013/0161670 A1 * | 6/2013 | Peng | 257/98 |

FOREIGN PATENT DOCUMENTS

| | | |
|---|---|---|
| JP | 10-300811 | 11/1998 |
| KR | 1020110034123 | 4/2011 |
| KR | 1020110076194 | 7/2011 |

* cited by examiner

*Primary Examiner* — Nikolay Yushin
(74) *Attorney, Agent, or Firm* — F. Chau & Associates, LLC

(57) ABSTRACT

A light emitting diode (LED) package comprises a LED, and a lead frame electrically connected to the LED. The lead frame includes a notch which has a predetermined size and a predetermined shape configured to separate a solder paste into two regions on either side of the notch when the solder paste is disposed on the lead frame.

10 Claims, 13 Drawing Sheets

LIGHT EMITTING DIODE PACKAGE

CROSS-REFERENCE TO RELATED APPLICATION

This application claims priority under 35 U.S.C. §119 to Korean Patent Application No. 10-2011-0123418, filed on Nov. 24, 2011, in the Korean Intellectual Property Office, the disclosure of which is incorporated by reference herein in its entirety.

TECHNICAL FIELD

The present inventive concept relates to a light emitting diode (LED) package, and more particularly, to an LED package adapted to measure a resistance of a solder paste bonded to a lead frame.

DISCUSSION OF THE RELATED ART

Recently, use of light emitting diodes (LEDs) is increasing. LEDs have low power consumption, a long lifespan, and a stylish appearance, for example In addition, the LED package market is growing.

LED packages are applicable to various information technology (IT) fields including general home products, industrial lighting markets, televisions (TV), mobile phones, personal computer (PC) monitors, and the like. LED packages are also applicable to electronic parts for vehicles, airplanes, ships, and the like, and to various lighting apparatuses such as a street light, a security light, and the like.

When an LED package is mounted on a printed circuit board (PCB), solder paste may be used. Durability of the solder paste may affect the reliability of the LED package. A resistance of the solder paste is generally measured to evaluate reliability of the solder paste.

SUMMARY

In an exemplary embodiment of the inventive concept, a light emitting diode (LED) package comprises a LED, and a lead frame electrically connected to the LED. The lead frame includes a notch which has a predetermined size and a predetermined shape configured to separate a solder paste into two regions on either side of the notch when the solder paste is disposed on the lead frame.

In an exemplary embodiment of the inventive concept, a LED package includes a lead frame with a first lead area and a second lead area physically separated from each other. In an embodiment, the first lead area includes the notch. In an embodiment, the second lead area includes another notch.

In an exemplary embodiment of the inventive concept, the predetermined shape includes a rectangular shape, a triangular shape, or a U shape.

In an exemplary embodiment of the inventive concept, an electronic system comprises a printed circuit board (PCB), a light emitting diode (LED) package mounted on the PCB, wherein the LED package includes the lead frame with a notch, and a solder paste disposed between the lead frame and the PCB. The solder paste includes a first solder area and a second solder area separated from each other and disposed on either side of the notch.

In an exemplary embodiment of the inventive concept, the notch has a predetermined size and a predetermined shape configured to separate the solder paste into the first and the second solder areas when the solder paste is disposed on the lead frame.

In an exemplary embodiment of the inventive concept, a manufacturing method for mounting a light emitting diode (LED) package on a printed circuit board (PCB) comprises forming a LED package including a lead frame with a notch, forming a solder paste on the lead frame, wherein the solder paste is separated into a first solder area and a second solder area disposed on either side of the notch, and measuring a resistance of the solder paste using a four-point probe method.

In an exemplary embodiment of the inventive concept, the four-point probe method includes a three-wires sensing arrangement.

In an exemplary embodiment of the inventive concept, the measuring a resistance comprises connecting a current source with the first solder area to supply a current, connecting a voltmeter with the second solder area to measure a voltage, and calculating the resistance based on the current and the voltage.

In an exemplary embodiment of the inventive concept, the lead frame includes a first lead area and a second lead area, the first solder and the second solder areas being disposed on the first lead area and a common electrode being connected between the current source and a solder paste disposed on the second lead area.

In an exemplary embodiment of the inventive concept, the manufacturing method further comprises determining whether the solder paste is reliable based on the resistance.

In an exemplary embodiment of the inventive concept, the manufacturing method further comprises mounting the LED package on the PCB using the solder paste when the determining whether the solder is reliable is a pass status.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
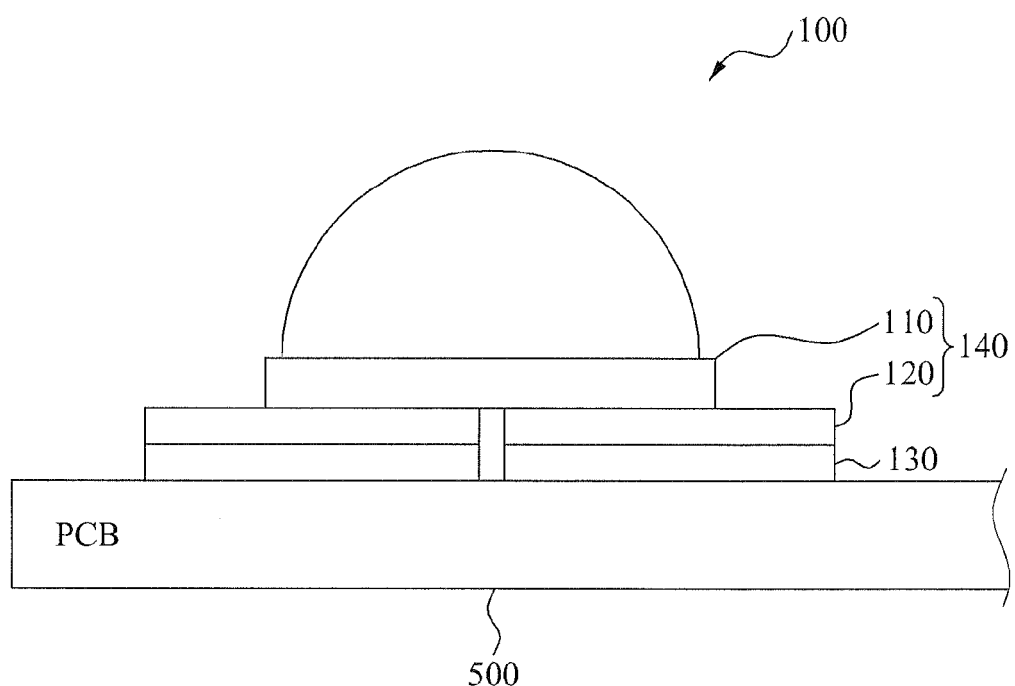
FIG. 1 is a side view illustrating an electronic system including a light emitting diode (LED) package according to an exemplary embodiment of the inventive concept.

Exemplary embodiments of the inventive concept will be described below, in more detail, with reference to the accompanying drawings. However, the inventive concept may be embodied in different forms and should not be construed as limited to the embodiments set forth herein. Like reference numerals may refer to the like elements throughout.

According to an exemplary embodiment of the present inventive concept, a light emitting diode (LED) package may include a lead frame which facilitates a resistance of the solder paste bonded to the lead frame to be accurately measured using a four-point probe method. With the resistance measured using a four-point probe method, durability of the solder paste is evaluated.

An LED package according to an exemplary embodiment of the inventive concept may measure a resistance of solder paste by bonding the solder paste, which has been separated into two parts to one of a separated lead frame.

Hereinafter, a structure of an LED package according to an exemplary embodiment of the inventive concept will be described.

FIG. 1 illustrates a side view of an electronic system including the LED package mounted on a printed circuit board (PCB) according to an exemplary embodiment of the inventive concept. Referring to FIG. 1, the electronic system 100 includes a LED package 140, a PCB 500, and a solder paste 130. The LED package 140 includes a LED 110, a lead frame 120 electrically connected to the LED 110 and separated into two lead areas. The solder paste 130 is disposed between the LED package 140 and the PCB 500. The solder paste 130 is bonded to the two lead areas separated from each other and also bonded to the PCB 500. For brevity of explanation, the LED package is assumed to include one LED and two lead areas, but the actual numbers of LED and lead areas included in a LED package are a matter of design choice.

In an exemplary embodiment of the inventive concept, a four point probe method is used to measure a resistance of the solder paste 130. For a four point probe method, the solder paste 130 is disposed on each of the two lead areas, and at least one lead area includes the solder paste 130, which is divided into two regions physically separated from each other. In an exemplary embodiment of the inventive concept, each lead area may include a solder paste physically divided into two regions physically separated from each other. Hereinafter, a process of forming an LED package according to an exemplary embodiment of the inventive concept will be described.

Figure 2:
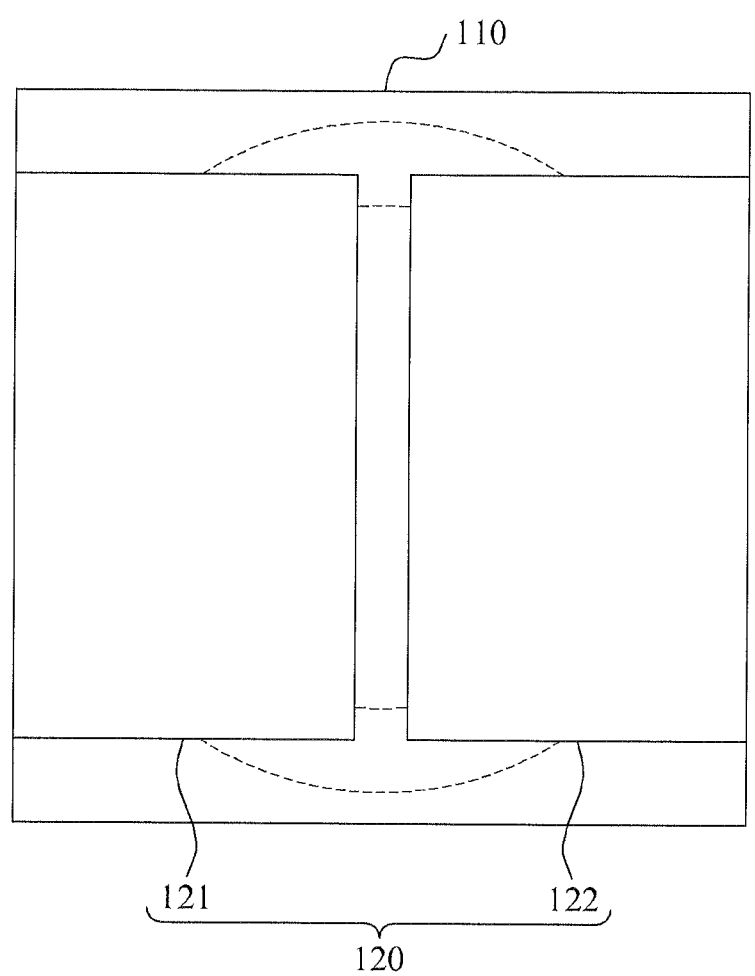
FIGS. 2 and 3 are diagrams illustrating a process of forming the lead frame of the LED package shown in FIG. 1, according to an exemplary embodiment of the inventive concept.
Figure 3:
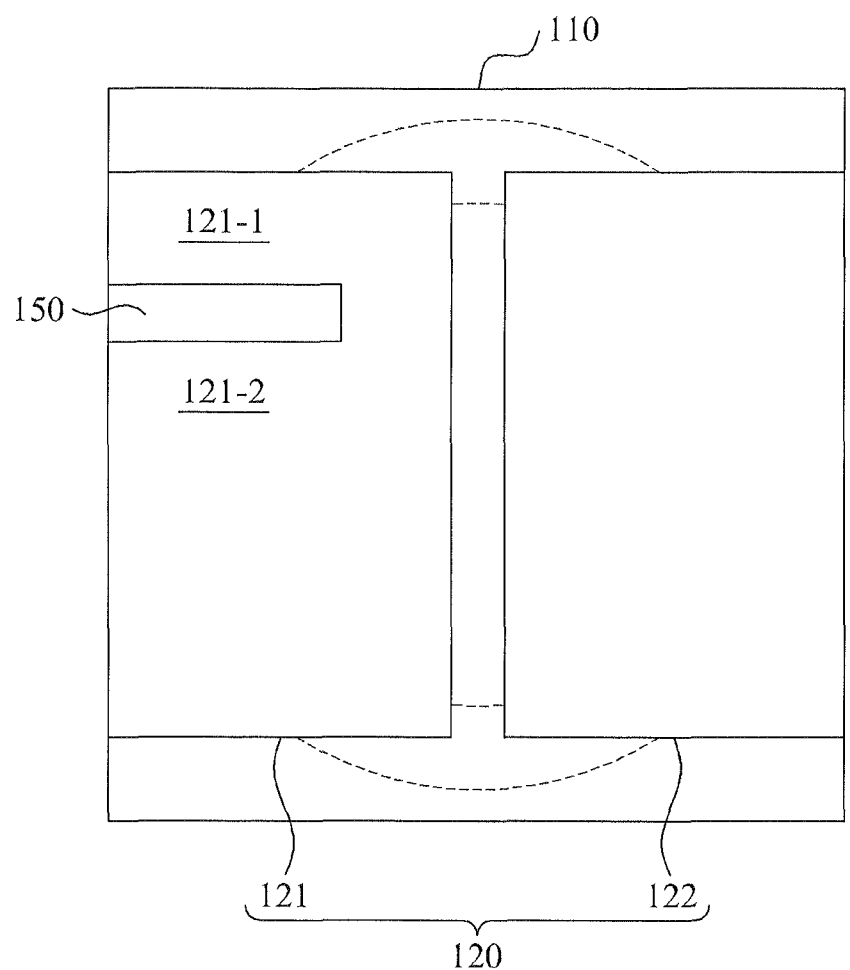

FIGS. 2 and 3 illustrate a process of forming the lead frame 120 of the LED package shown in FIG. 1. Referring to FIG. 2, the lead frame 120 of the LED package may be separated into two lead areas: a first lead area 121 and a second lead area 122. Referring to FIG. 3, the first lead area 121 of the lead frame 120 includes a rectangular shaped notch 150 on one side of the first lead frame 120. The rectangular shaped notch 150 partially separates the first lead area 121 into two areas 121_1 and 121_2 defined by the notch 150 so that a solder paste is formed on the two areas 121_1 and 121_2, respectively.

In an exemplary embodiment of the inventive concept, part of the lead frame 120 may have various shaped notches so that the solder paste is divided into the first solder area and the second solder area. Such various shaped notches will be explained in detail later in FIGS. 7 through 12.

Figure 4:
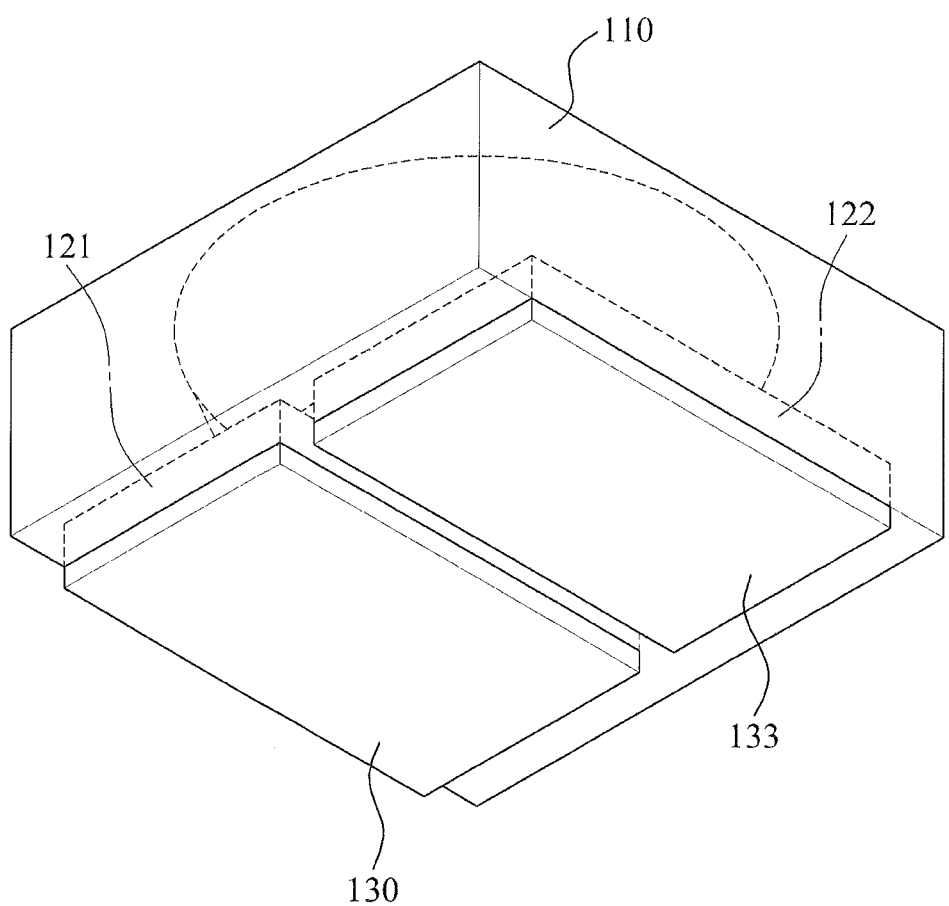
FIGS. 4 and 5 are diagrams illustrating a process of forming solder paste of the LED package shown in FIG. 1, according to an exemplary embodiment of the inventive concept.
Figure 5:
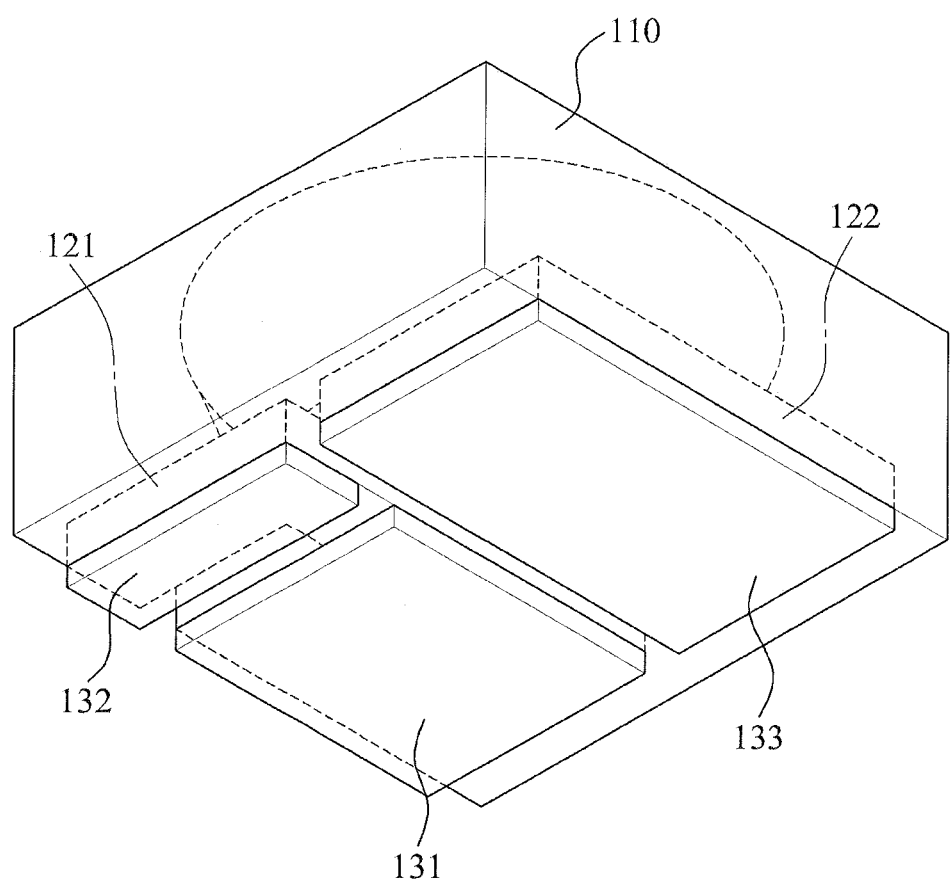

FIGS. 4 and 5 illustrate a process of forming solder paste 130 of the LED package shown in FIG. 1. As shown in FIG. 4, a solder paste layer 130 is formed on an overall surface of the first lead area 121 and a solder paste 133 is formed on an overall surface of the second lead area 122. As shown in FIG. 5, the solder paste 130 formed on the first lead area 121 is separated into two solder areas 131 and 132, respectively. For the first lead area 121, the solder paste 130 is separated into a first solder area 131 and a second solder area 132 due to the rectangular shaped notch 150 of FIG. 3, which separates partially the first lead area 121 into two regions 121_1 and 121_2. For example, the first solder area 131 is formed on the region 121_2, and the second solder area 132 is formed on the region 121_1. In FIG. 5, the solder paste layer 130 is separated into two regions, because the solder paste layer 130 retracts itself to minimize its surface energy when the solder paste layer 130 is wetted on the lead frame as shown in FIG. 4.

Figure 6:
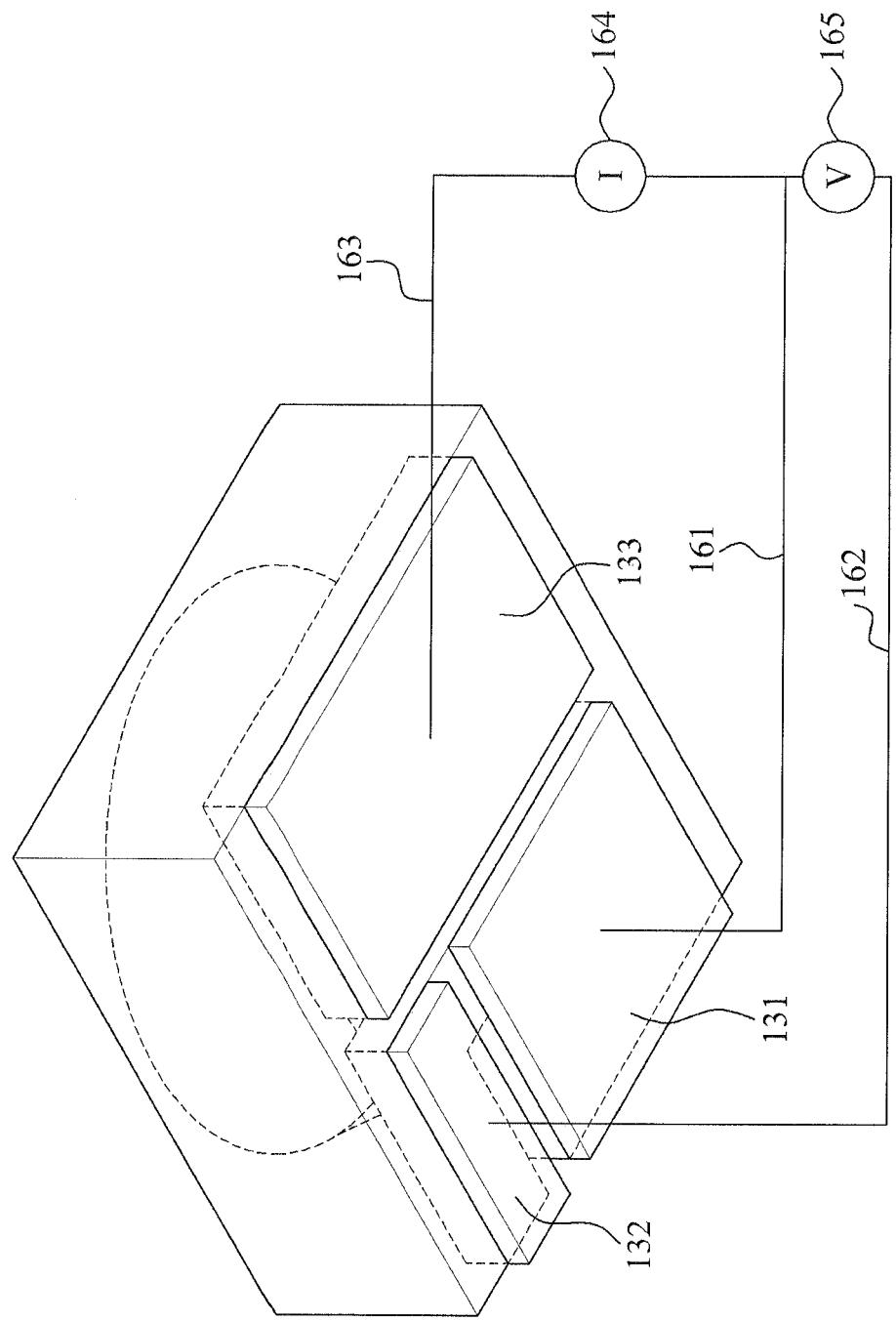
FIG. 6 is a diagram illustrating a circuit structure for measuring a resistance of the solder paste of the LED package shown in FIG. 1, according to an exemplary embodiment of the inventive concept.

FIG. 6 illustrates a circuit structure for measuring the resistance of the solder paste of the LED package shown in FIG. 1. Specifically, FIG. 6 illustrates a three-wire sensing arrangement which is a variant of a four-point probe method. Referring to FIG. 6, a first solder area 131 is connected to a current lead 161, a second solder area 132 is connected to a voltage lead 162, and a solder paste 133 is connected to a common lead 163. Under such arrangement, a current source supplies a predetermined amount of current to the LED package through the current lead 161 and the common lead 163. Using the voltage lead 162 and the common lead 163, a voltage meter 165 measures a voltage generated by the current. In other words, a current and a voltage of the solder paste are measured by a four-point probe method, thereby calculating the resistance of the solder paste disposed on the lead frame.

According to exemplary embodiments of the inventive concept, the lead frame 120 of the LED package may include a notch having various shapes and sizes to separate the solder paste 130 into at least two areas.

FIGS. 7 to 12 are diagrams illustrating various shaped notches of a lead frame of the LED package shown in FIG. 1 according to exemplary embodiments of the present inventive concept. Referring to FIGS. 7 to 12, the lead frame 120 of the LED package includes two areas, each of which may be partially separated by a notch shaped structure sufficient to divide a solder paste when the solder paste is formed on the lead frame 120.

Figure 7:
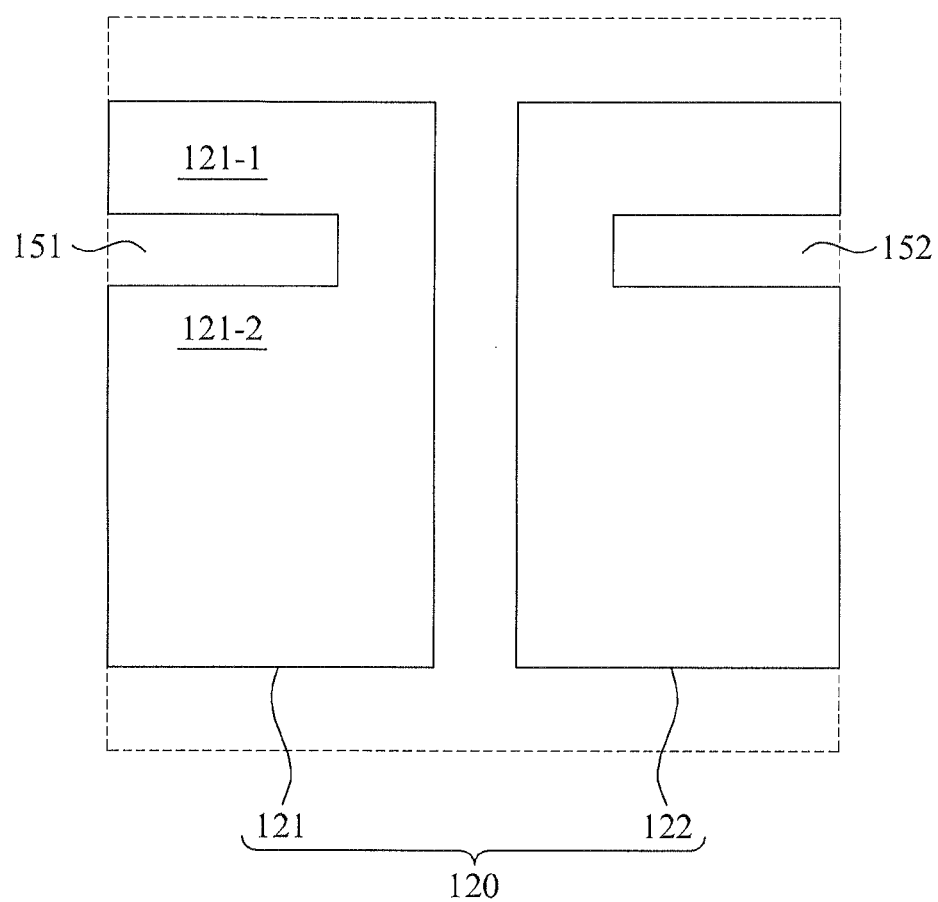
FIGS. 7 to 12 are diagrams illustrating various lead frames of the LED package shown in FIG. 1, according to an exemplary embodiment of the inventive concept.

In FIG. 7, the lead frame 120 includes two lead areas 121 and 122. Each lead area 121 and 122 includes rectangular shaped notches 151 and 152, respectively. The rectangular shaped notches 151 and 152 partially separate each of the lead areas 121 and 122 into two regions, respectively. For example, the rectangular shaped notch 151 separates the lead area 121 into two regions 121_1 and 121_2.

Figure 8:
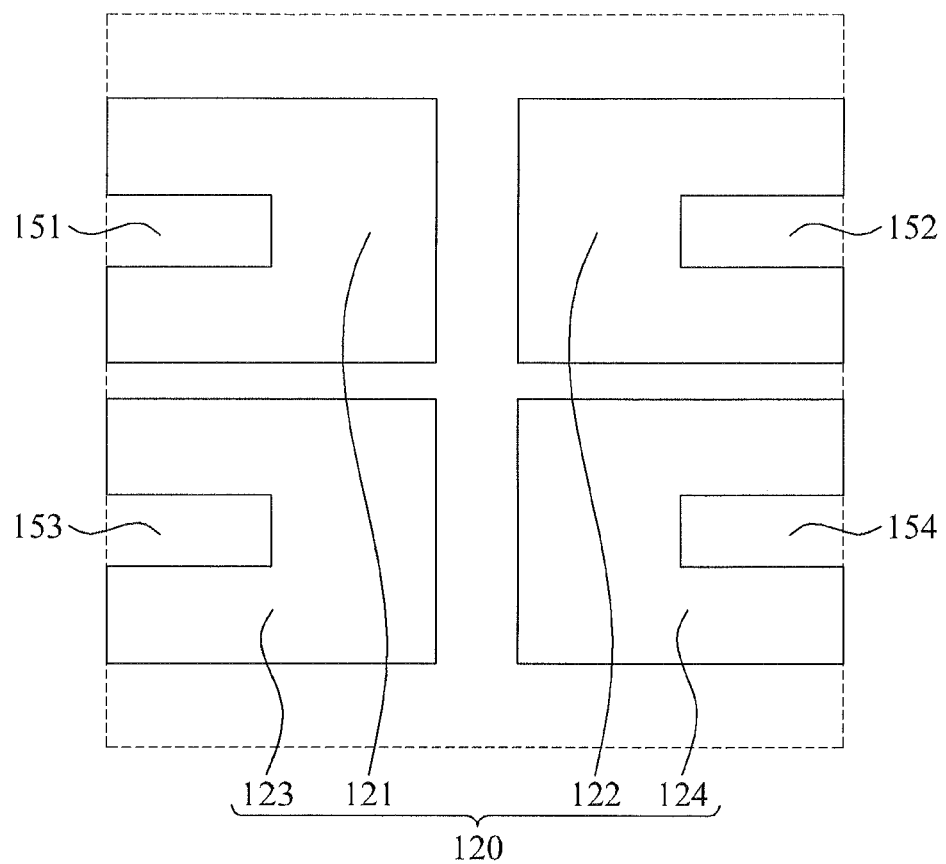

In FIG. 8, the lead frame 120 includes four lead areas 121-124. Each lead area includes rectangular shaped notches 151-154, respectively. The rectangular shaped notches 151-154 partially separate the lead areas 121-124, respectively, as explained in FIGS. 5 and 7.

Figure 9:
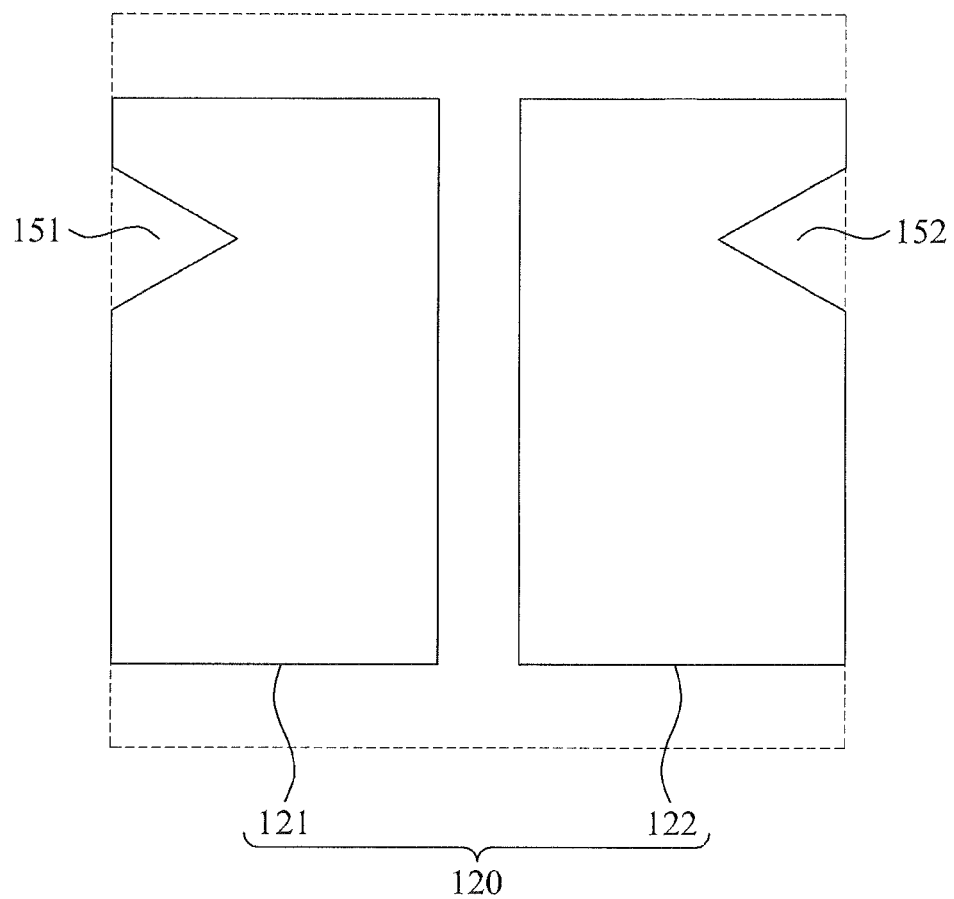

In FIG. 9, the lead frame 120 includes two lead areas 121 and 122. Each lead area 121 and 122 includes triangular shaped notches 151 and 152, respectively. The triangular shaped notches 151 and 152 partially separate the lead areas 121 and 122, respectively.

Figure 10:
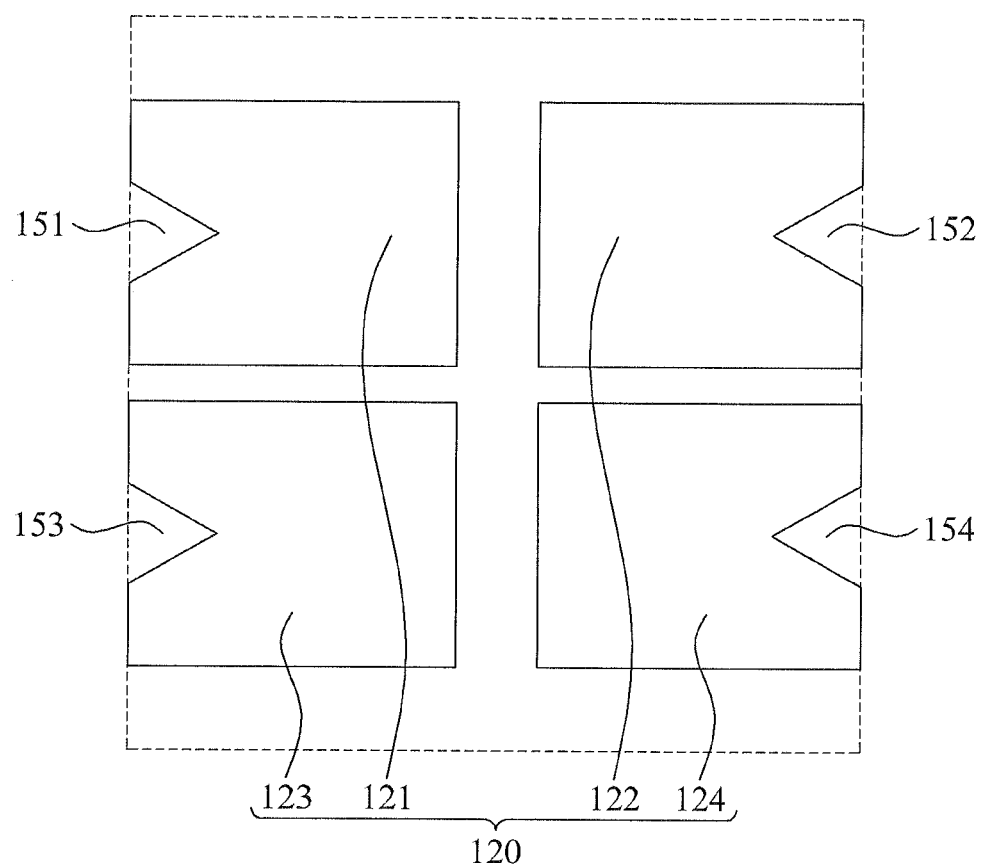

In FIG. 10, the lead frame 120 includes four lead areas 121-124. Each lead area includes triangular shaped notches 151-154, respectively. The triangular shaped notches 151-154 partially separate the lead areas 121-124, respectively.

Figure 11:
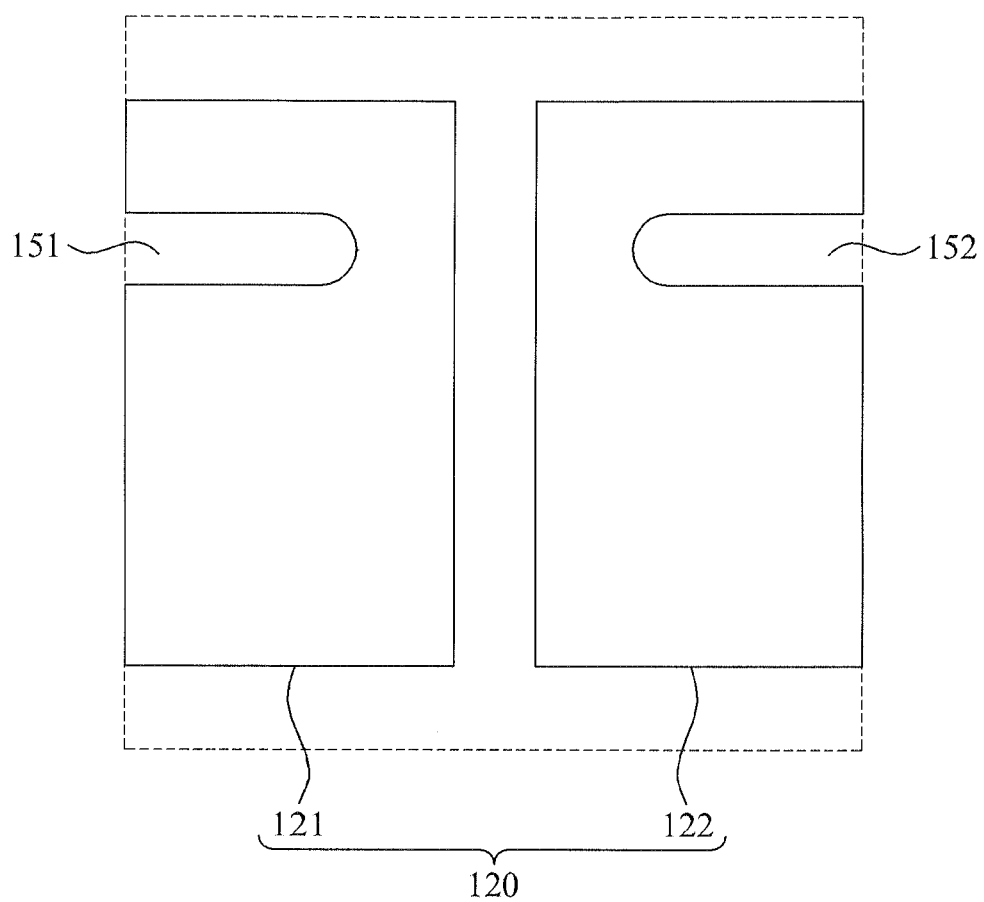

In FIG. 11, the lead frame 120 includes two lead areas 121 and 122. Each lead area includes U-shaped notches 151 and 152, respectively. The U-shaped notches 151 and 152 partially separate the lead areas 121 and 122, respectively.

Figure 12:
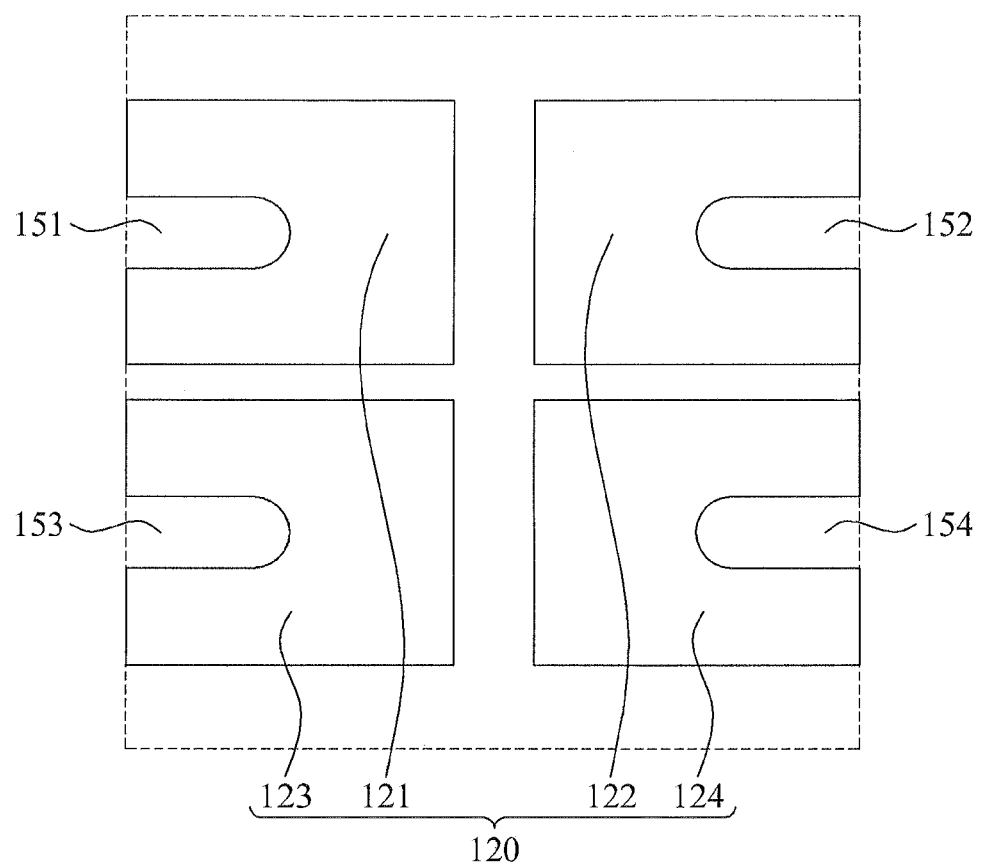

In FIG. 12, the lead frame 120 includes four lead areas 121-124. Each lead area includes U-shaped notches 151-154, respectively. The U-shaped notches 151-154 partially separate the lead areas 121-124, respectively.

Hereinafter, a manufacturing method of an LED package according to an embodiment of the inventive concept will be described.

Figure 13:
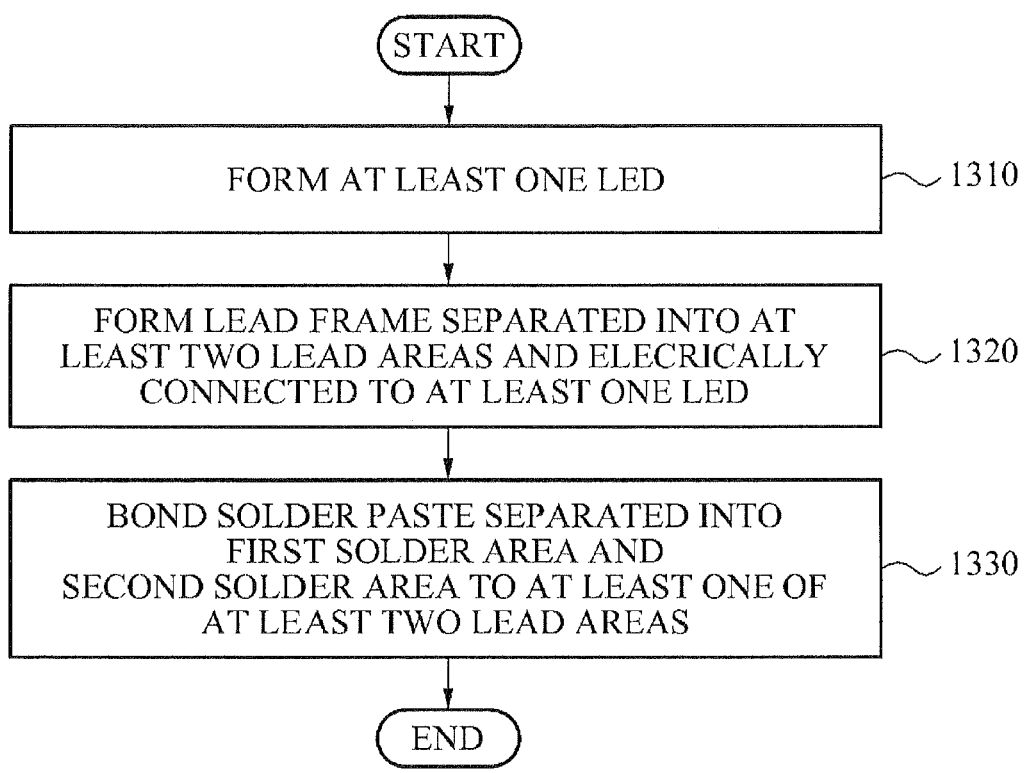
FIG. 13 is a flowchart illustrating a manufacturing method of an LED package according to an exemplary embodiment of the inventive concept.

FIG. 13 is a flowchart illustrating a manufacturing method of an LED package according to an embodiment of the present invention. Referring to FIG. 13, at least one LED is formed in operation 1310.

In operation 1320, a lead frame is formed to include at least two lead areas and to be electrically connected to the at least one LED.

In operation 1330, solder paste is formed to be separated into a first solder area and a second solder area and to be bonded to at least one of the at least two lead areas.

According to an exemplary embodiment of the inventive concept, the LED package may include at least one lead frame, which may be partially separated by a notch shaped structure large enough to separate a solder paste into two regions when the solder paste is formed on the lead frame 120. In such lead frame structure, a resistance of the solder paste is measured by a four-point probe method. For example, a current and a voltage may be measured by connecting a current source to the first solder area and connecting a voltmeter to the second solder area. Accordingly, the resistance of the solder paste may be calculated.

Since the resistance of the solder paste of a circuit substrate connection module is measured in real time in a manufacturing process, self monitoring of reliability of the circuit substrate connection module may be achieved. In addition, with the measured resistance of the solder paste, whether the solder paste is reliable is determined. If the result is a pass status, the LED package may be mounted on the PCB using the solder paste.

The above-described exemplary embodiments of the present inventive concept may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the exemplary embodiments, or they may be construed by programmers skilled in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present inventive concept, or vice versa.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A light emitting diode (LED) package comprising:
a LED; and
a lead frame electrically connected to the LED, the lead frame including a notch partially cutting at least one side of the lead frame into two areas wherein the LED is disposed on the lead frame and overlapping the two areas.

2. The LED of claim 1, wherein the notch is configured to separate a solder paste into two regions on either side of the notch when the solder paste is disposed on the lead frame.

3. The LED of claim 2, wherein the notch includes a rectangular shape.

4. The LED of claim 2, wherein the notch includes a triangular shape.

5. The LED of claim 2, wherein the notch includes a U shape.

6. The LED package of claim 2, wherein the lead frame includes a first lead area and a second lead area physically separated from each other.

7. The LED package of claim 3, wherein the first lead area includes the notch.

8. The LED package of claim 4, wherein the second lead area includes another notch.

9. An electronic system comprising:
a printed circuit board (PCB);
a light emitting diode (LED) package mounted on the PCB, wherein the LED package includes a lead frame including a notch partially cutting at least one side of the lead frame; and
a solder paste disposed between the lead frame and the PCB, the solder paste including a first solder portion and a second solder portion separated from each other, the first solder portion disposed on one side of the notch and the second solder portion disposed on the opposite side of the notch.

10. The electronic system of claim 9, wherein the notch is configured to separate the solder paste into the first and the second solder areas when the solder paste is disposed on the lead frame.

* * * * *